(12) United States Patent
Lövenich et al.

(10) Patent No.: US 9,087,994 B2
(45) Date of Patent: Jul. 21, 2015

(54) PEDOT DISPERSIONS IN ORGANIC SOLVENTS

(75) Inventors: Wilfried Lövenich, Bergisch Gladbach (DE); Arnulf Scheel, Köln (DE); Knud Reuter, Krefeld (DE); Andreas Elschner, Mülheim (DE)

(73) Assignee: Heraeus Precious Metals GmbH & Co. KG, Hanau (DE)

( * ) Notice: Subject to any disclaimer, the term of this patent is extended or adjusted under 35 U.S.C. 154(b) by 95 days.

(21) Appl. No.: 13/883,177

(22) PCT Filed: Nov. 2, 2011

(86) PCT No.: PCT/EP2011/005508
§ 371 (c)(1),
(2), (4) Date: Jul. 1, 2013

(87) PCT Pub. No.: WO2012/059215
PCT Pub. Date: May 10, 2012

(65) Prior Publication Data
US 2013/0270537 A1    Oct. 17, 2013

Related U.S. Application Data

(60) Provisional application No. 61/471,934, filed on Apr. 5, 2011.

(30) Foreign Application Priority Data

Nov. 3, 2010 (DE) .......................... 10 2010 050 130

(51) Int. Cl.
*H01L 29/08*      (2006.01)
*H01L 21/00*      (2006.01)
(Continued)

(52) U.S. Cl.
CPC .............. *H01L 51/0043* (2013.01); *C08L 9/06* (2013.01); *C08L 53/025* (2013.01); *C08L 65/00* (2013.01);
(Continued)

(58) Field of Classification Search
CPC ......... C08L 53/025; C08L 65/00; C08L 9/06; H01B 1/127; H01L 51/0037; H01L 51/5088; H01L 51/0043; H01G 11/56; H01G 11/48
USPC ............ 525/88, 212; 257/40; 438/46; 521/33
See application file for complete search history.

(56) References Cited

U.S. PATENT DOCUMENTS 5,035,926 A    7/1991    Jonas et al.
5,300,575 A    4/1994    Jonas et al.
(Continued)

FOREIGN PATENT DOCUMENTS

DE        102008023008        11/2009
EP        0339340              11/1989
(Continued)

OTHER PUBLICATIONS

International Search Report of PCT/EP2001/005508, mailed on Feb. 6, 2012, 2 pgs.
(Continued)

*Primary Examiner* — Nathan M Nutter
(74) *Attorney, Agent, or Firm* — Servilla Whitney LLC

(57) ABSTRACT

Described is a complex comprising a polythiophene and a sulphonated synthetic rubber. Also described is a process for producing complexes, the complexes obtained by this process, a composition, a layer structure, a process for producing the layer structure, the layer structure obtained by this process, electronic components, and the use of a composition.

25 Claims, 1 Drawing Sheet

(51) Int. Cl.
H01L 51/00 (2006.01)
C08L 9/06 (2006.01)
C08L 53/02 (2006.01)
C08L 65/00 (2006.01)
H01B 1/12 (2006.01)
H01L 51/50 (2006.01)
H01G 11/48 (2013.01)
H01G 11/56 (2013.01)
C08G 61/12 (2006.01)

(52) U.S. Cl.
CPC ............... *H01B 1/127* (2013.01); *H01G 11/48* (2013.01); *H01G 11/56* (2013.01); *H01L 51/0037* (2013.01); *H01L 51/5088* (2013.01); *C08G 61/126* (2013.01); *C08G 2261/3223* (2013.01); *C08G 2261/44* (2013.01); *C08G 2261/794* (2013.01); *Y02E 60/13* (2013.01)

(56) References Cited

U.S. PATENT DOCUMENTS

| | | | | |
|---|---|---|---|---|
| 5,378,402 | A * | 1/1995 | Cross et al. | 252/500 |
| 7,436,754 | B2 * | 10/2008 | Kojima et al. | 369/126 |
| 2002/0136923 | A1 | 9/2002 | Jonas et al. | |
| 2004/0053060 | A1 | 3/2004 | Roziere et al. | |
| 2004/0176557 | A1 | 9/2004 | Mertens et al. | |
| 2007/0265379 | A1 * | 11/2007 | Chen et al. | 524/404 |
| 2011/0168946 | A1 | 7/2011 | Loevenich et al. | |
| 2013/0059953 | A1 | 3/2013 | Jonas et al. | |

FOREIGN PATENT DOCUMENTS

| | | |
|---|---|---|
| EP | 0440957 | 8/1991 |
| EP | 0587360 | 3/1994 |
| EP | 1227529 | 7/2002 |
| JP | 2006-176752 | 7/2006 |
| JP | 2006/247145 | 9/2006 |
| JP | 2008-253012 | 10/2008 |
| WO | WO-02/20068 | 3/2002 |
| WO | WO-02/072660 | 9/2002 |
| WO | WO-03/048228 | 6/2003 |
| WO | WO-2009/135752 | 11/2009 |

OTHER PUBLICATIONS

Written Opinion of PCT/EP2011/005508, 2012, 5 pgs.
Groenendaal, L. et al., "Poly(3,4-ethylenedioxythiophene) and Its Derivatives: Past, Present, and Future", *Adv. Mater*, vol. 12, Issue 7 2000, pp. 481-494.
Idibie, C. A. et al., "Sulphonation of polystyrene-butadiene rubber with chlorosulphonic acid for proton exchange membrane: Kinetic study", *Journal of Applied Polymer Science*, vol. 116, Issue. 6 2010, pp. 3473-3479.
Kabanov, Viktor A., "Polyelectrolyte complexes in solution and in bulk", *Russian Chemical Reviews*, vol. 74, Issue 1 2005, pp. 3-20.
Kim, Jinhwan, "Proton conductivities and methanol permeabilities of membranes made from partially sulfonated polystyrene-block-poly(ethylene-ran-butylene)-block-polystyrene copolymers", *Journal of Membrane Science*, vol. 207, Issue 1 2002, pp. 129-137.
Luebben, Silvia, "Solvent Processable Conducting Block Copolymers Based on Poly(3,4-ethylenedioxythiophene)", *Polymeric Materials: Science & Engineering*, vol. 91 2004, p. 979.
Mani, Sudhir et al., "Microstructure of Ionomers Based on Sulfonated Block Copolymers of Polystyrene and Poly(ethylene-alt-propylene)", *Macromolecules*, vol. 32, Issue 11 1999, pp. 3663-3670.
Picchioni, Francesco, "Blending of styrene-block-butadiene-block-styrene copolymer with sulfonated vinyl aromatic polymers", *Polymer International*, vol. 50, Issue 6 2001, pp. 714-721.
Serpico, J. M. et al., "Transport and Structural Studies of Sulfonated Styrene—Ethylene Copolymer Membranes", *Macromolecules*, vol. 35, Issue 15 2002, pp. 5916-5921.
Wu, Chi et al., "Light-Scattering Studies of Styrene—(Ethylene-co-butylene)—Styrene Triblock Copolymer and Its Sulfonated Ionomers in Tetrahydrofuran", *Macromolecules*, vol. 29, Issue 16 1996, pp. 5361-5367.
Xie, Hong-Quan et al., "Preparation, characterization, and some properties of ionomers from a sulfonated styrene—butadiene—styrene triblock copolymer without gelation", *J. Appl. Polym. Sci.*, vol. 96, Issue 4 2005, pp. 1398-1404.
Yamamoto, Takakazu, "Neutral poly(3,4-ethylenedioxythiophene-2,5-diyl)s: preparation by organometallic polycondensation and their unique p-doping behavior", *Polymer*, vol. 43, Issue 3 2002, pp. 711-719.

* cited by examiner

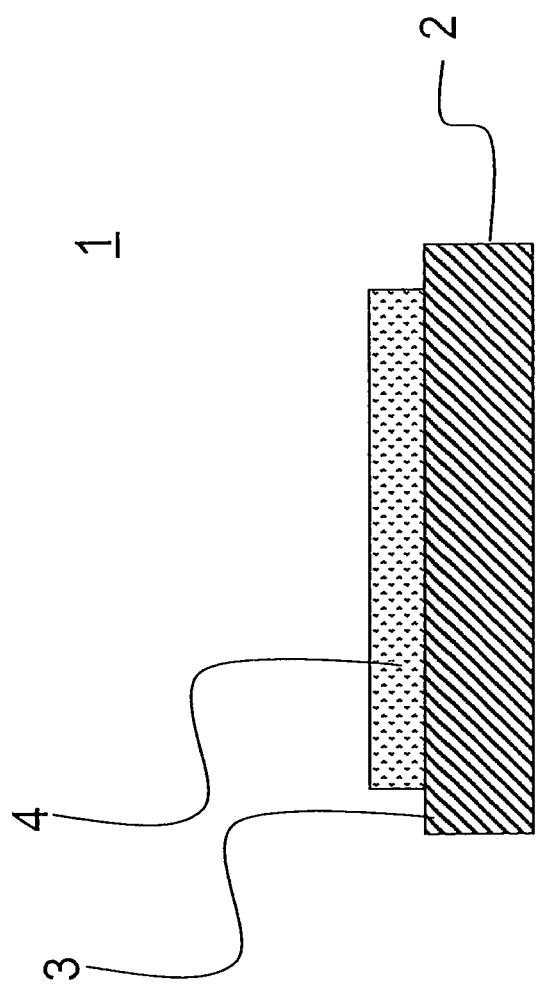

PEDOT DISPERSIONS IN ORGANIC SOLVENTS

CROSS-REFERENCE TO RELATED APPLICATIONS

This application is the National Stage entry of PCT/EP2011/005508, filed on Nov. 2, 2011, which claims priority to U.S. Provisional Application Ser. No. 61/471,934, filed on Apr. 5, 2011, and German Patent Application Number DE 10 2010 050 130.1, filed on Nov. 3, 2010, which are incorporated herein by reference in their entireties.

TECHNICAL FIELD

The present invention relates to complexes comprising a polythiophene and a sulphonated synthetic rubber, a process for producing complexes, the complexes obtainable by this process, a composition, a layer structure, a process for producing a layer structure, the layer structure obtainable by this process, electronic components and the use of a composition.

BACKGROUND

Conductive polymers are increasingly gaining in economic importance, since polymers offer advantages over metals with regard to processability, weight and the selective adjustment of properties by means of chemical modification. Examples of known π-conjugated polymers are polypyrroles, polythiophenes, polyanilines, polyacetylenes, polyphenylenes and poly(p-phenylene vinylenes). Layers of conductive polymers are widely used technically, for example as polymeric counter-electrodes in capacitors or for through-hole plating in printed circuit boards. Conductive polymers are produced by chemical or electrochemical oxidation from monomeric precursors, such as for example from optionally substituted thiophenes, pyrroles and anilines and optionally oligomeric derivatives thereof. Chemical oxidative polymerization in particular is widespread, since it is technically simple to carry out in a liquid medium or on diverse substrates.

A particularly important polythiophene used technically is poly(ethylene-3,4-dioxythiophene) (PEDOT or PEDT) as described for example in EP 0 339 340 A2, which is produced by chemical polymerization of ethylene-3,4-dioxythiophene (EDOT or EDT) and which in its Oxidized form exhibits very high conductivity values. A survey of numerous poly(alkylene-3,4-dioxythiophene) derivatives, in particular poly(ethylene-3,4-dioxythiophene) derivatives, their monomer units, syntheses and applications is provided by L. Groenendaal, F. Jonas, D. Freitag, H. Pielartzik & J. R. Reynolds, Adv. Mater. 12, (2000) p. 481-494.

Dispersions of PEDOT with polyanions, such as for example polystyrene sulphonic acid (PSS), as disclosed for example in EP 0 440 957 A2, have acquired particular importance in industry. These dispersions can be used to produce transparent, conductive films which have found numerous applications, for example as an antistatic coating or as a hole-injection layer in organic light-emitting diodes (OLEDs), as shown in EP 1 227 529 A2.

The polymerization of EDOT takes place in an aqueous solution of the polyanion to form a polyelectrolyte complex. Cationic polythiophenes, which for the purposes of charge compensation comprise polymeric anions as counterions, are often also referred to by experts as polythiophene/polyanion complexes. By virtue of the polyelectrolyte properties of PEDOT as a polycation and PSS as a polyanion this complex is not a true solution but rather a dispersion. The extent to which polymers or portions of polymers are dissolved or dispersed is dependent on the mass ratio of the polycation and the polyanion, on the charge density of the polymers, on the salt concentration of the environment and on the nature of the surrounding medium (V. Kabanov, Russian Chemical Reviews 74, 2005, 3-20). The transitions here can be fluid. For that reason no distinction is made hereafter between the terms "dispersed" and "dissolved". Likewise no distinction is made between "dispersion" and "solution" or between "dispersant" and "solvent". Rather these terms are used synonymously hereafter.

As described above, complexes of PEDOT and PSS have found a wide variety of applications. However, the disadvantage of using PSS as the polyanion is that it is soluble in water and in water-miscible organic solvents, for instance in lower alcohols such as ethanol or methanol, but not in water-immiscible organic solvents. The dispersing of conductive polymers such as PEDOT in water-immiscible solvents is however desirable in some cases, since firstly such solvents can be removed comparatively easily by evaporation and such solvent systems are distinguished by particularly good film-forming properties. Secondly, dispersions comprising PEDOT are frequently used in combination with paint systems, which however are often based on water-immiscible solvents or solvent systems.

Moreover, aqueous PEDOT/PSS dispersions have the disadvantage that the lifetime of OLEDs with hole-injection layers produced from these dispersions is in need of further improvement. In particular, when PEDOT/PSS dispersions are used to produce hole-injection layers in OLEDs, the luminance of the OLEDs decreases comparatively quickly in some circumstances.

PEDOT-comprising systems based on non-aqueous or low-water-content solvent systems are already known from the prior art.

Thus EP-A-1 373 356 and WO-A-2003/048228 for instance describe the production of polythiophene-polyanion complexes in anhydrous or low-water-content solvents. The solvent water is exchanged here for another water-miscible organic solvent. To this end the second solvent is added and then water is removed, by distillation for example. The disadvantage of this procedure is that the distillation requires a two-stage process to be used. The added solvent must moreover be miscible with water, and this likewise limits the choice to polar solvents.

In JP-A-2005-068166 Otani et al. describe a method in which a conductive polymer such as PEDOT is first dried and then dispersed in an organic solvent. Organic solvents having a dielectric constant of 5 or more are cited in particular. Isopropyl alcohol and gamma-butyrolactone are cited in the examples. This method too has the disadvantage that polar solvents are necessary for the renewed dissolution. This method is also disadvantageous in that the conductive polymer has to be synthesised first, then dried and then dispersed again. Otani et al. also disclose no polythiophene-polyanion complexes.

WO-A-2009/135752 likewise describes PEDOT-comprising compositions based on water-immiscible solvent systems. As polyanions the PEDOT/polyanion complexes described in this prior art preferably comprise styrene-styrene sulphonic acid copolymers in which the styrene units are alkylated in para-position, such as for example poly(p-styrene ethyl sulphonate-co-p-dodecylstyrene). The disadvantage of this approach, however, is that the production of such styrene-styrene sulphonic acid copolymers requires a comparatively large number of synthesis steps. In particular such polyanions are very difficult to obtain commercially. In addition, the conductivity of these layers described in this prior art is comparatively low.

A number of works describe furthermore how a polythiophene can be made soluble by attaching side groups to the thiophene monomer and then polymerizing it or by producing a block copolymer from thiophene units and units intended to increase the solubility. Thus Luebben et al. (Polymeric Materials: Science & Engineering 2004, 91, 979) describe the production of a block copolymer from PEDOT and polyethylene glycol. Perchlorate and p-toluenesulphonic acid act as counterions here. The polymers are soluble in polar organic solvents such as propylene carbonate and nitromethane. Conductivities in a range from $10^{-4}$ S/cm to 1 S/cm are measured. The cited block copolymers have the disadvantage, however, that they are soluble only in very polar solvents. Moreover, the selected counterions make no contribution to film formation, so conductive films cannot be formed with these block copolymers. Further publications describe the production of organic polythiophene solutions by introducing side groups to the thiophene which contribute to the solubility. Thus Yamamoto et al. (Polymer 43, 2002, 711-719) describe the production of hexyl derivatives of PEDOT which as a neutral molecule is soluble in organic solvents. In principle this method has the disadvantage that the introduction of side chains to the thiophene influences not only the solubility properties but also the electronic properties of the molecule.

SUMMARY

Embodiments of the present invention are directed to a complex comprising a polythiophene and a sulphonated synthetic rubber. In one or more embodiments, the sulphonated synthetic rubber is a sulphonated synthetic rubber derived from hydrogenated or unhydrogenated, optionally partially alkyl-substituted styrene-diene copolymers. In a specific embodiment, the sulphonated synthetic rubber is a sulphonated synthetic rubber derived from hydrogenated, optionally partially alkyl-substituted styrene-diene block copolymer. In a more specific embodiment, the sulphonate synthetic rubber is a sulphonated synthetic rubber derived from hydrogenated, optionally partially alkyl-substituted styrene-butadiene or styrene-isoprene block copolymers. In a very specific embodiment, the sulphonated synthetic rubber is a sulphonated synthetic rubber derived from hydrogenated, optionally partially alkyl-substituted styrene-isoprene block copolymers.

In one or more embodiments, the sulphonate synthetic rubber is a sulphonated styrene-butadiene copolymer, in which at least a portion of the styrene units or at least a portion of the butadiene units or at least a portion of the styrene units and at least a portion of the butadiene units in the copolymer are sulphonated.

In one or more embodiments, the functionalized styrene-butadiene copolymer is obtained by sulphonation of a styrene-butadiene copolymer. In a specific embodiment, the styrene-butadiene copolymer is a block copolymer.

In one or more embodiments, the ion-exchange capacity of the sulphonated synthetic rubber is between 0.01 and 5 meq/g. The sulphonated synthetic rubber can have a weight-average molecular weight (Mw) determined by gel permeation chromatography in a range from 1000 to 10,000,000 g/mol.

In one or more embodiments, the polythiophene is a poly (3,4-ethylenedioxythiophene).

In one or more embodiments, the complex is obtained by a process in which the thiophene monomer is oxidatively polymerized in the presence of the sulphonated synthetic rubber.

A second aspect of the present invention is directed to a process for producing complexes comprising a polythiophene and a sulphonated synthetic rubber. In one or more embodiments, the process comprises oxidatively polymerizing a thiophene monomer in the presence of a sulphonated synthetic rubber.

In one or more embodiments, the sulphonated synthetic rubber is a sulphonated synthetic rubber derived from hydrogenated or unhydrogenated, optionally partially alkyl-substituted styrene-diol copolymers. In a specific embodiments, the sulphonated synthetic rubber is a sulphonated synthetic rubber derived from hydrogenated, optionally partially alkyl-substituted styrene-diene block copolymers. In a more specific embodiment, the sulphonated synthetic rubber is a sulphonated synthetic rubber derived from hydrogenated, optionally partially alkyl-substituted styrene-butadiene or styrene-isoprene block copolymers. In a more specific embodiment, the sulphonated synthetic rubber is a sulphonated synthetic rubber derived from hydrogenated, optionally partially alkyl-substituted styrene-isoprene block copolymers. In a very specific embodiment, the sulphonated synthetic rubber is a sulphonated styrene-butadiene copolymer, in which at least a portion of the styrene units or at least a portion of the butadiene units or at least a portion of the styrene units and at least a portion of the butadiene units in the copolymer are sulphonated.

In one or more embodiments, the oxidative polymerization of the thiophene monomer takes place in a water-immiscible organic solvent or a mixture of water-immiscible organic solvents.

A third aspect of the present invention is directed to a complex obtained by the process of the invention.

A fourth aspect of the present invention is directed to a composition comprising a water-immiscible organic solvent and the complex according to one or more embodiments dissolved or dispersed in the organic solvent. In one or more embodiments, the composition is obtained by oxidatively polymerizing a thiophene monomer is the presence of a sulphonated synthetic rubber in a water-immiscible organic solvent or a mixture of water-immiscible organic solvents.

In one or more embodiments, the composition comprises less than 1 wt % of water, relative to the total weight of the composition.

A fifth aspect of the present invention is directed to a layer structure comprising a substrate and an electrically conductive layer applied to at least a part of the substrate, wherein the electrically conductive layer comprises the complex according to one or more embodiments.

A sixth aspect of the present invention is directed to a process for producing the layer structure according to one or more embodiments. In one or more embodiments, the process comprises providing a substrate, applying a composition according to one or more embodiments to at least a portion of the surface of the substrate, and at least partially removing the organic solvent to obtain an electrically conductive layer comprising a complex comprising a polythiophene and a sulphonated synthetic rubber.

A further aspect of the present invention is directed to a layer structure obtained according to the process of one or more embodiments. In one or more embodiments, the electrically conductive layer has a specific resistance of less than 10,000 Ω·cm.

A still further aspect of the present invention is directed to an electronic component comprising a layer structure according to one or more embodiments.

A yet further aspect of the present invention is directed to a method of producing an electrically conductive layer in an electronic component or an antistatic coating. In one or more embodiments, the method comprises using the composition of one or more embodiments as an electrically conductive layer or as an antistatic coating.

BRIEF DESCRIPTION OF THE DRAWINGS

FIG. 1: Cross-sectional view of a layer structure according to one or more embodiments.

DETAILED DESCRIPTION

There is a need to overcome the disadvantages of the prior art relating to complexes comprising polythiophenes and polyanions.

In particular, the present invention provides complexes comprising polythiophenes and polyanions which can be produced and used in water-immiscible organic solvent systems.

These systems based on water-immiscible organic solvents are distinguished by advantageous film-forming properties and allow the production of, for example, hole-injection layers in OLEDs, which are distinguished by a particularly long lifetime. Layers produced from such systems are distinguished by as low a surface resistance as possible.

In addition, the polyanions comprised in the complexes and therefore also the complexes themselves are able to be produced by as simple synthesis steps as possible, preferably from starting materials that are readily available commercially.

Furthermore, compositions, in particular coating compositions, are provided which deliver polythiophene-comprising complexes in particularly high concentrations, in particular in concentrations above those of conventional PEDOT/PSS dispersions.

Provided are complexes comprising
a polythiophene and
a sulphonated synthetic rubber, preferably a sulphonated synthetic rubber on the basis of (derived from) styrene copolymer, particularly preferably a sulphonated synthetic rubber on the basis of (derived from) hydrogenated or unhydrogenated, optionally partially alkyl-substituted styrene-diene copolymers, yet more preferably a sulphonated synthetic rubber on the basis of (derived from) hydrogenated or unhydrogenated, optionally partially alkyl-substituted styrene-diene block copolymers, yet more preferably a sulphonated synthetic rubber on the basis of (derived from) hydrogenated, optionally partially alkyl-substituted styrene-butadiene or styrene-isoprene block copolymers and most preferably a sulphonated synthetic rubber on the basis of (derived from) hydrogenated, optionally partially alkyl-substituted styrene-isoprene block copolymers.

The complexes according to the invention comprise as one component a sulphonated synthetic rubber.

As used herein, the term "sulphonated" means that in the styrene units and/or diene units concerned, preferably in the optionally hydrogenated butadiene or isoprene units, an —SO$_3$X group is bonded to at least one C atom of these units via the sulphur atom, X being selected from the group consisting of H$^+$, NH$_4^+$, Na$^+$, K$^+$ or Li$^+$. It is preferable if the —SO$_3$X group is almost exclusively bound to the styrene unit and accordingly sulphonated styrene units are present.

The terms "hydrogenated, optionally partially alkyl-substituted styrene-diene copolymers", "hydrogenated, optionally partially alkyl-substituted styrene-diene block copolymers" or "hydrogenated, optionally partially alkyl-substituted styrene-butadiene or styrene-isoprene block copolymers" are understood respectively to refer to copolymers or block copolymers, in which the double bond of the diene unit has been hydrogenated, but not the aromatic ring system of the styrene unit. The terms styrene-diene copolymers or styrene-diene block copolymers are further understood to refer to a polymer which comprises at least styrene and diene monomer units, whereby the presence of further co-monomers is not excluded.

The terms "alkyl-substituted styrene-diene copolymers" or "alkyl-substituted styrene-diene block copolymers" are understood as referring to copolymers or block copolymers, in which the styrene unit is alkyl-substituted, whereby a methyl group, an ethyl group, an isopropyl group or tert-butyl group is considered as alkyl substituent.

As used herein, the term "sulphonated styrene unit" means the unit (I)

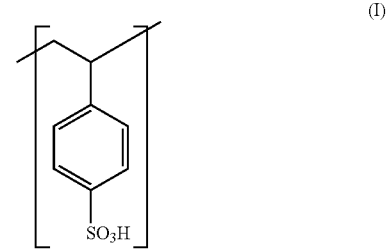

whilst a "sulphonated butadiene unit" is understood to mean, for example, the unit (II)

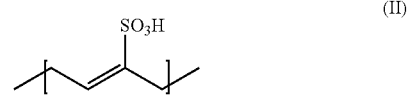

In place of the acid shown in units (I) and (II) the sulphonate group can also be bonded in the form of a salt, for example in the form of an ammonium salt or an alkali salt, in particular in the form of an Na$^+$, K$^+$ or Li$^+$ salt.

The hydrogenated or unhydrogenated, optionally partially alkyl-substituted styrene-diene copolymers comprised in the complexes according to the invention as sulphonated synthetic rubber are obtained by sulphonating a styrene-diene copolymer, which can optionally be hydrogenated.

The hydrogenated or unhydrogenated, optionally partially alkyl-substituted styrene-diene copolymer can, in principle, be a random styrene-diene copolymer or a styrene-diene block copolymer. As used herein, the term "block" refers to a polymer unit consisting of at least 2, preferably at least 4, still more preferably at least 6, still more preferably at least 8 and most preferably at least 10 identical monomer units following immediately on from one another.

The hydrogenated or unhydrogenated block copolymers can in turn be copolymers in which only the styrene units are present in blocks, those in which only the diene units (or the hydrogenated forms of the diene units) are present in blocks, or those in which both the diene units (or the hydrogenated forms of the diene units) and the styrene units are present in blocks. Hydrogenated or unhydrogenated block copolymers are also conceivable in which for example styrene blocks are present in addition to monomeric styrene and diene units (or the hydrogenated forms of the diene units), diene blocks (or blocks of the hydrogenated forms of the diene units) in addition to monomeric styrene and diene units (or the hydrogenated forms of the diene units), styrene blocks and diene blocks (or blocks of the hydrogenated forms of the diene units) in addition to monomeric diene units (or the hydrogenated form of the diene units), styrene blocks and diene blocks (or blocks of the hydrogenated forms of the diene units) in addition to monomeric styrene units or styrene blocks and diene blocks (or blocks of the hydrogenated forms of the diene units) in addition to monomeric diene units (or the hydrogenated forms of the diene units), and monomeric styrene units.

According to a specific embodiment, the complexes comprise hydrogenated or unhydrogenated, preferably hydrogenated styrene-isoprene block copolymers with the structure A-B-A, in which the block A corresponds to a sulphonated polystyrene block and the block B corresponds to a hydrogenated or unhydrogenated, preferably however to a hydrogenated polyisoprene block (a fully hydrogenated polyisoprene block corresponds chemically to a block of alternating copolymerized ethylene-propylene units). In one or more embodiments, the length of the blocks A and B is at least 5 monomer units, preferably at least 10 units and most preferably at least 20 units.

According to another specific embodiment, the complexes comprise hydrogenated or unhydrogenated, preferably hydrogenated styrene-isoprene block copolymers with the structure to A-B-C-B-A, in which the block A corresponds to a polystyrene block which is at least partially substituted with tert-butyl groups, the block B corresponds to a hydrogenated or unhydrogenated, preferably however to a hydrogenated polyisoprene block (a fully hydrogenated polyisoprene block corresponds chemically to a block of alternating copolymerized ethylen-propylene units) and the block C corresponds to a sulphonated polystyrene block. In one or more embodiments, the lengths of the blocks A, B and C is at least 5 monomer units, preferably at least 10 units and most preferably at least 20 units. Such copolymers are for example obtainable from the company Kraton Polymers, Houston, USA, under the product name NEXAR®.

There are no limits in principle regarding the weight ratio of styrene units to diene units in the hydrogenated or unhydrogenated styrene-diene copolymer or the hydrogenated or unhydrogenated styrene-diene block copolymer, used for sulphonation. For example, the copolymer or block copolymer can be based on 5 to 95 wt. %, preferably 15 to 80 wt. % and most preferably 25 to 65 wt. % of polymerized styrene and 95 to 5 wt. %, preferably 80 to 15 wt. % and most preferably 65 to 25 wt. % of polymerized, optionally hydrogenated diene, whereby the total amount of optionally hydrogenated diene and styrene is preferably 100 wt. %. However, the total amount does not have to add to 100 wt. % if further monomer units are present in the copolymer or block copolymer in addition to the styrene units and the optionally hydrogenated diene units.

The degree of sulphonation of the sulphonated synthetic rubber, preferably of the sulphonated synthetic rubber on the basis of (derived from) styrene copolymer, particularly preferably of the sulphonated synthetic rubber on the basis of (derived from) hydrogenated or unhydrogenated, optionally partially alkyl-substituted styrene-diene copolymers, yet more preferably of the sulphonated synthetic rubber on the basis of (derived from) hydrogenated or unhydrogenated, optionally partially alkyl-substituted styrene-diene block copolymers, yet more preferably of the sulphonated synthetic rubber on the basis of (derived from) hydrogenated, optionally partially alkyl-substituted styrene-diene block copolymers, yet more preferably of the sulphonated synthetic rubber on the basis of (derived from) hydrogenated, optionally partially alkyl-substituted styrene-butadiene or styrene-isoprene block copolymers and most preferably of the sulphonated synthetic rubber on the basis of (derived from) hydrogenated, optionally partially alkyl-substituted styrene-isoprene block copolymers, is preferably defined by the equivalent to weight or the ion-exchange capacity. Within the meaning of the present invention the equivalent weight is understood to be the amount of polymer necessary to neutralise 1 liter of 1N sodium hydroxide solution. The equivalent weight is thus a measure of the concentration of the ion-exchanging sulphonic acid groups. The equivalent weight is given in eq/g. The inverse of the equivalent weight is the ion-exchange capacity. The ion-exchange capacity is given in eq/g or meq/g. According to one or more embodiments, the ion-exchange capacity of the sulphonated synthetic rubber is between 0.01 and 5 meq/g, preferably between 0.05 and 4 meq/g, more preferably between 0.2 and 3.5 meq/g and most preferably between 1 and 2.5 meq/g.

In conjunction with the sulphonated synthetic rubber, it is furthermore preferable for it to have a weight-average molecular weight ($M_w$) in a range from 1000 to 10,000,000 g/mol, particularly preferably in a range from 10,000 to 1,000,000 g/mol and most preferably in a range from 100,000 to 1,000,000 g/mol. The molecular weight is determined by gel permeation chromatography using polymers of defined molecular weights, in particular using polystyrene in the case of solutions in water-immiscible solvents or using polystyrene sulphonic acid in the case of water-miscible solvents.

Methods for producing functionalized synthetic rubbers, for example styrene-butadiene copolymers, are described for example in Idibie et al., Journal of Applied Polymer Science, 116(6) (2010), pages 3473-3479, in Picchioni et al., Polymer International, 50 (2001), pages 714-721, in H. Q. Xie et al., J. Appl. Polym. Sci. 96(4), 2005, pp. 1398-1404 or in EP-A-0 587 360. The disclosure of these publications regarding the production of functionalized styrene-butadiene copolymers is herein incorporated by reference in its entirety.

Processes for preparation of hydrogenated, sulphonated synthetic rubbers are described for example in J. Kim et al., J. Membrane Sci. 207(1), 2002, p. 129-137, C. Wu et al., Macromolecules 29(16), 1996, p. 5361-5367, S. Mani et al. Macromolecules 32 (11), 1999, p. 3663-3670 and J. M. Serpico et al., Macromolecules 35(15), 2002, p. 5916-5921. Kim et al. and Wu et al. describe the sulfonation of hydrogenated styrene-butadiene rubber, Mani et al. the sulfonation of hydrogenated styrene-isoprene rubber and Serpico et al. the sulfonation of a styrene-ethylene copolymer.

In addition to the aforementioned sulphonated synthetic rubber which is can be present as a polyanion, the complex according to the invention comprises a polythiopene which can be present as a polycation and hence as an electrically conductive polymer.

In one or more embodiments, the polythiophene comprises repeating units of the general formula (III)

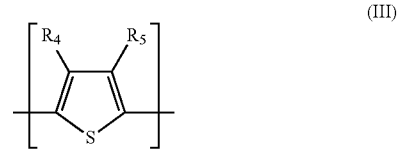

wherein
$R_4$ and $R_5$ independently of each other each denote H, an optionally substituted $C_1$-$C_{18}$ alkyl radical or an optionally substituted $C_1$-$C_{18}$ alkoxy radical, $R_4$ and $R_5$ together denote an optionally substituted $C_1$-$C_8$ alkylene radical, wherein one or more C atoms can be replaced by one or more identical or different heteroatoms selected from O or S, preferably a $C_1$-$C_8$ dioxyalkylene radical, an optionally substituted $C_1$-$C_8$ oxythiaalkylene radical or an optionally substituted $C_1$-$C_8$ dithiaalkylene radical, or an optionally substituted $C_1$-$C_8$ alkylidene radical, wherein at least one C atom is optionally replaced by a heteroatom selected from O or S.

In specific embodiments, the polythiophenes comprise repeating units of the general formula (III-a) and/or (III-b)

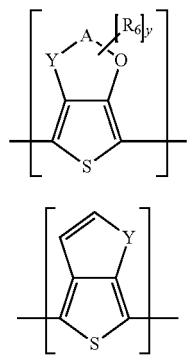

(III-a)

(III-b)

wherein
A denotes an optionally substituted $C_1$-$C_5$ alkylene radical, preferably an optionally substituted $C_2$-$C_3$ alkylene radical,
Y denotes O or S,
$R_6$ denotes a linear or branched, optionally substituted $C_1$-$C_{18}$ alkyl radical, preferably linear or branched, an optionally substituted $C_1$-$C_{14}$ alkyl radical, an optionally substituted $C_5$-$C_{12}$ cycloalkyl radical, an optionally substituted $C_6$-$C_{14}$ aryl radical, an optionally substituted $C_7$-$C_{18}$ aralkyl radical, an optionally substituted $C_7$-$C_{18}$ alkaryl radical, an optionally substituted $C_1$-$C_4$ hydroxyalkyl radical or a hydroxyl radical, and
y denotes a whole number from 0 to 8, preferably 0, 1 or 2, particularly preferably 0 or 1, and
wherein if several radicals $R_6$ are bonded to A, they can be identical or different.

The general formula (III-a) is understood to mean that the substituent $R_6$ can be bonded y times to the alkylene radical A.

In specific embodiments of the complex, polythiophenes comprising repeating units of the general formula (III) are those comprising repeating units of the general formula (III-aa) and/or of the general formula (III-ab)

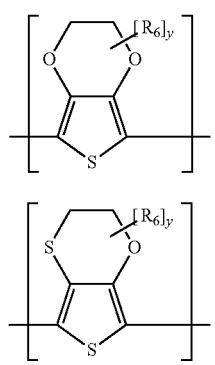

(III-aa)

(III-ab)

wherein $R_6$ and y have the meaning given above.

In still further specific embodiments of the complex, polythiophenes comprising repeating units of the general formula (III) are those comprising polythiophenes of the general formula (III-aaa) and/or of the general formula (III-aba)

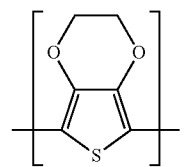

(III-aaa)

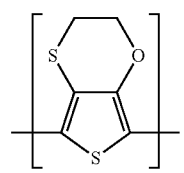

(III-aba)

As used herein, the prefix "poly" means that more than one identical or different repeating unit is included in the polythiophene. The polythiophenes comprise in total n repeating units of the general formula (III), wherein n can be a whole number from 2 to 2000, preferably 2 to 100. The repeating units of the general formula (III) within a polythiophene can in each case be identical or different. In a specific embodiment, the polythiophenes comprise in each case identical repeating units of the general formula (III).

In one or more embodiments, the polythiophenes each bear H at the end groups.

In one or more embodiments the polythiophene having repeating units of the general formula (III) comprises: poly (3,4-ethylenedioxythiophene), poly(3,4-ethyleneoxythiathiophene) or poly(thieno[3,4-b]thiophene), i.e. a homopolythiophene comprising repeating units of the formula (III-aaa), (III-aba) or (III-b), in which Y=S, a homopolymer comprising repeating units (III-aaa) (poly(3,4-ethylenedioxythiophene)) being most preferred.

The optionally substituted polythiophenes are cationic, wherein "cationic" relates only to the charges located on the polythiophene main chain. Depending on the substituent at the radicals $R_4$ and $R_5$, the polythiophenes can bear positive and negative charges in the structural unit, the positive charges being located on the polythiophene main chain and the negative charges optionally at the radicals R substituted with sulphonate or carboxylate groups. The positive charges of the polythiophene main chain can be partially or completely saturated by the optionally present anionic groups at the radicals R. Considered as a whole, the polythiophenes can be cationic, neutral or even anionic in these cases. Nevertheless, in the context of the invention they are all considered as cationic polythiophenes, since the positive charges on the polythiophene main chain are decisive. The positive charges are not represented in the formulae because they are mesomerically delocalised. However, the number of positive charges is at least 1 and at most n, where n is the total number of all repeating units (identical or different) within the polythiophene.

The weight ratio of polythiophene to the sulphonated synthetic rubber (polythiophene:sulphonated synthetic rubber), in the complexes according to the invention is in a range from 1:0.1 to 1:100, preferably in a range from 1:0.2 to 1:20 and particularly preferably in a range from 1:0.5 to 1:10.

Provided is a process for producing complexes comprising
a polythiophene and
a sulphonated synthetic rubber, preferably a sulphonated synthetic rubber on the basis of (derived from) styrene copolymer, particularly preferably a sulphonated synthetic rubber on the basis of (derived from) hydrogenated or unhydrogenated, optionally partially alkyl-substituted styrene-diene copolymers, yet more preferably a sulphonated synthetic rubber on the basis of (derived from) hydrogenated or unhydrogenated, optionally partially alkyl-substituted styrene-diene block copolymers, yet more preferably a sulphonated synthetic rubber on the basis of (derived from) hydrogenated, optionally partially alkyl-substituted styrene-diene block copolymers, yet more preferably a sulphonated synthetic rubber on the basis of (derived from) hydrogenated, optionally partially alkyl-substituted styrene-butadiene or styrene-isoprene block copolymers and most preferably a sulphonated synthetic rubber on the basis of (derived from) hydrogenated, optionally partially alkyl-substituted styrene-isoprene block copolymers,
wherein thiophene monomers are oxidatively polymerized in the presence of the sulphonated synthetic rubber.

Processes for producing the monomeric precursors for the production of the polythiophenes comprising repeating units of the general formula (III) and derivatives thereof are known to the person skilled in the art and are described for example in L. Groenendaal, F. Jonas, D. Freitag, H. Pielartzik & J. R. Reynolds, Adv. Mater. 12 (2000) 481-494 and in the literature cited therein. Mixtures of different precursors can also be used.

Derivatives of the aforementioned thiophenes are understood to be, for example, dimers or trimers of these thiophenes. Higher-molecular-weight derivatives, i.e. tetramers, pentamers, etc., of the monomeric precursors are also possible as derivatives. The derivatives can be made up of both identical and different monomer units and can be used in pure form and in mixtures with one another and/or with the aforementioned thiophenes. Oxidized or reduced forms of these thiophenes and thiophene derivatives are also encompassed within the meaning of the invention by the term "thiophenes" and "thiophene derivatives", provided that their polymerization gives rise to the same conductive polymers as with the aforementioned thiophenes and thiophene derivatives.

In one or more embodiments, suitable thiophene monomers for the production of optionally substituted polythiophenes comprising repeating units of the general formula (III) are optionally substituted 3,4-alkylenedioxythiophenes, which can be represented by way of example by the general formula (IV)

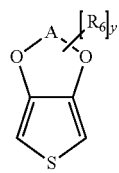

(IV)

in which A, $R_6$ and y have the meaning cited in connection with formula (III-a) and in which if several radicals R are bonded to A, they can be identical or different.

In one or more embodiments, the thiophene monomers are optionally substituted 3,4-ethylenedioxythiophenes. In a specific embodiment, unsubstituted 3,4-ethylenedioxythiophene is used as the thiophene monomer.

In the process according to the invention the thiophene monomers are oxidatively polymerized in the presence of the sulphonated synthetic rubber, preferably in the presence of the hydrogenated or unhydrogenated sulphonated styrene-diene copolymers or styrene-diene block copolymers, wherein as the sulphonated synthetic rubber and in particular as hydrogenated or unhydrogenated sulphonated styrene-diene copolymers or styrene-diene block copolymers, the synthetic rubbers, copolymers and block copolymers already mentioned above in connection with the complexes according to the invention as the preferred sulphonated synthetic rubber are particularly preferred.

The oxidizing agents that are suitable for the oxidative polymerization of pyrrole can be used as oxidizing agents. For practical reasons, inexpensive and easy-to-handle oxidizing agents are preferred, for example iron(III) salts such as $FeCl_3$, $Fe(ClO_4)_3$ and the iron(III) salts of organic acids and of inorganic acids comprising organic radicals. The iron(III) salts of sulphuric acid hemiesters of $C_1$-$C_{20}$ alkanols, for example the Fe(III) salt of lauryl sulphate, are cited by way of example as iron(III) salts of inorganic acids comprising organic radicals. The following are cited by way of example as iron(III) salts of organic acids: the Fe(III) salts of $C_1$-$C_{20}$ alkyl sulphonic acids, such as methane- and dodecane-sulphonic acid; aliphatic $C_1$-$C_{20}$ carboxylic acids such as 2-ethylhexyl carboxylic acid; aliphatic perfluorocarboxylic acids, such as trifluoroacetic acid and perfluorooctanoic acid; aliphatic dicarboxylic acids such as oxalic acid and above all of aromatic sulphonic acids optionally substituted with $C_1$-$C_{20}$ alkyl groups, such as benzenesulphonic acid, p-toluenesulphonic acid and dodecylbenzenesulphonic acid. The iron(III) salts of organic acid have the big applicational advantage that they are partially or completely soluble in organic solvents and in particular in water-immiscible organic solvents. Organic peroxides such as for example tert-butyl peroxide, diisobutyryl peroxide, di-n-propyl peroxydicarbonate, didecanoyl peroxide, dibenzoyl peroxide, tert-butyl peroxybenzoate, di-tert-amyl peroxide can also be used as oxidizing agents. Organic azo compounds such as, for example, 2,2'-azodiisobutyronitrile can also be used.

According to the process of one or more embodiments, the oxidative polymerization of the thiophene monomers takes place in the presence of the sulphonated synthetic rubber, in a water-immiscible organic solvent, or a mixture of water-immiscible organic solvents.

Linear, branched or cyclic aliphatic hydrocarbons such as, for example, pentane, hexane, heptane, octane, petroleum ether, cyclohexane, methyl cyclohexane or cycloheptane, aromatic hydrocarbons such as for example benzene, toluene or xylene, ethers such as for example diethyl ether, diisopropyl ether, methyl tert-butyl ether, halogenated hydrocarbons such as for example dichloromethane, chloroform, tetrachloromethane, trichloroethane and trichloroethene, halogenated aromatic hydrocarbons such as for example chlorobenzene, aliphatic nitriles such as for example acetonitrile, aliphatic sulphoxides and sulphones such as for example dimethyl sulphoxide or sulpholane, aliphatic carboxylic acid amides such as for example methyl acetamide, dimethyl acetamide or dimethyl formamide, ketones such as for example acetone, methyl ethyl ketone or methyl t-butyl ketone, esters such as for example methyl acetate, ethyl acetate or butyl acetate or mixtures of these water-immiscible organic solvents are cited as examples of suitable water-immiscible organic solvents.

The concentration of thiophene monomers and of sulphonated synthetic rubber in the water-immiscible organic solvent or in the mixture of water-immiscible organic solvents is chosen to such that after oxidative polymerization of the thiophene monomers in the presence of the sulphonated synthetic rubber, a dispersion is obtained which comprises the complexes comprising polythiophene and sulphonated synthetic rubber in a concentration in a range from 0.1 to 30 wt. %, preferably in a range from 0.5 to 20 wt. % and still more preferably in a range from 1 to 10 wt. %.

According to a further embodiment of the process, the oxidative polymerization of the thiophene monomers in the presence of the sulphonated synthetic rubber to takes place in the presence of less than 5 wt. %, preferably less than 1 wt. % and more preferably less than 0.5 wt. % of water, relative in each case to the total weight of the reaction mixture.

Provided are complexes obtainable by the process described above.

Provided is a composition comprising a water-immiscible organic solvent or a mixture of water-immiscible organic solvents and by the complexes according to the invention dissolved or dispersed in this organic solvent or in this mixture of organic solvents or by the complexes obtainable by the process according to the invention.

The solvents already cited above as water-immiscible organic solvents in connection with the process according to the invention for producing complexes are preferred as water-immiscible organic solvents.

Such a composition is obtained by the process according to the invention for producing complexes if the oxidative polymerization of the thiophene monomers is performed in the presence of the sulphonated synthetic rubber in the corresponding water-immiscible organic solvent or the corresponding mixture of water-immiscible organic solvents.

The composition comprises the complexes comprising polythiophene and sulphonated synthetic rubber, preferably the hydrogenated or unhydrogenated sulphonated styrene-diene copolymers or styrene-diene block copolymers, in a concentration in a range from 0.1 to 40 wt. %, more preferably in a range from 1 to 30 wt. % and even more preferably in a range of from 1 to 10 wt. %. In a specific embodiment the composition is distinguished by a high solids content. Solids contents are from 0.1 to 60 wt. %, preferably from 1 to 50%, more preferably from 2 to 40 wt. %, still more preferably from 5 to 30% and most preferably from 7.5 to 20 wt. %.

According to a specific embodiment of the composition it has a water content determined by the test method described herein of less than 5 wt. %, preferably less than 1 wt. % and most preferably less than 0.5 wt. %, relative in each case to the total weight of the composition.

Provided is a layer structure comprising a substrate and an electrically conductive layer applied to at least a part of the substrate surface, wherein the electrically conductive layer comprises the complexes according to the invention or the complexes obtained by the process according to the invention.

In one or more embodiments, plastic films are used as the substrate, preferably transparent plastic films, which conventionally have a thickness in a range from 5 to 5000 μm, preferably in a range from 10 to 2500 μm and more preferably in a range from 100 to 1000 μm. Such plastic films can be based, for example, on polymers such as polycarbonates, polyesters such as for example PET and PEN (polyethylene terephthalate and polyethylene naphthalene dicarboxylate), copolycarbonates, polysulphones, polyether sulphones (PES), polyimides, polyamides, polyethylene, polypropylene or cyclic polyolefins or cyclic olefin copolymers (COC), polyvinyl chloride, polystyrene, hydrogenated styrene polymers or hydrogenated styrene copolymers. In addition to plastic materials, substrates based in particular on metals or metal oxides are also suitable as substrates, such as for example ITO layers (indium-tin-oxide layers) or the like. Glass too can be used as a substrate.

Provided is a process for producing a layer structure comprising the following process steps:
I) providing a substrate;
II) applying a composition according to the invention;
III) At least partially removing the organic solvent to obtain an electrically conductive layer comprising the complexes according to the invention or the complexes obtained by the process according to the invention.

In process step I) of this process a substrate is provided first of all, wherein substrates already cited above as substrates in connection with the layer structure according to the invention are preferred as substrates. The surface of the substrates can be pretreated prior to applying the electrically conductive layer, for example by corona treatment, flame treatment, fluorination or plasma treatment, to improve the polarity of the surface and hence the wettability and chemical affinity.

Before the composition according to the invention is applied to the substrate surface in process step II) for the purpose of forming a layer, further additives which, for example, raise the conductivity can also be added to the composition, such as, for example, ether group-comprising compounds such as, for example, tetrahydrofuran, lactone group-comprising compounds such as butyrolactone, valerolactone, amide group- or lactam group-comprising compounds such as caprolactam, N-methyl caprolactam, N,N-dimethyl acetamide, N-methyl acetamide, N,N-dimethyl formamide (DMF), N-methyl formamide, N-methyl formanilide, N-methylpyrrolidone (NMP), N-octyl pyrrolidone, pyrrolidone, sulphones and sulphoxides, such as, for example, sulpholane (tetramethylene sulphone), dimethyl sulphoxide (DMSO), sugar or sugar derivatives, such as, for example, sucrose, glucose, fructose, lactose, sugar alcohols such as, for example, sorbitol, mannitol, furan derivatives such as, for example, 2-furan carboxylic acid, 3-furan carboxylic acid, and/or di- or polyalcohols such as, for example, ethylene glycol, glycerol or di- or triethylene glycol. Tetrahydrofuran, N-methyl formamide, N-methylpyrrolidone, ethylene glycol, dimethyl sulphoxide or sorbitol are particularly preferably used as conductivity-raising additives.

One or more organic binders which, in particular, are soluble in organic solvents, such as polyvinyl acetate, polycarbonate, polyvinyl butyral, polyacrylic acid esters, polyacrylic acid amides, polymethacrylic acid esters, polymethacrylic acid amides, polystyrene, polyacrylonitrile, polyvinyl chloride, polyvinyl pyrrolidones, polybutadiene, polyisoprene, polyethers, polyesters, polyurethanes, polyamides, polyimides, polysulphones, silicones, epoxy resins, styrene-acrylate, vinyl acetate/acrylate and ethylene/vinyl acetate copolymers, polyvinyl alcohols or cellulose derivatives, can also be added to the composition. The proportion of the polymeric binder, if used, is conventionally in a range from 0.1 to 95 wt. %, relative to the total weight of the coating composition.

Bases or acids, for example, can be added to the coating compositions to adjust the pH. In specific embodiments, the additives do not adversely affect the film forming of the dispersions, such as, for example, the bases 2-(dimethylamino)ethanol, 2,2'-iminodiethanol or 2,2',2"-nitrilotriethanol.

According to a specific embodiment of the process to produce a layer structure, crosslinking agents which allow crosslinking of the composition following application on the substrate surface can also be added to the composition prior to application on the substrate surface. The solubility of the coating in organic solvents can also be lowered in this way. Melamine compounds, capped isocyanates, functional silanes, for example tetraethoxysilane, alkoxysilane hydrolysates for example based on tetraethoxysilane, or epoxysilanes such as 3-glycidoxypropyl trialkoxysilane are cited as examples of suitable crosslinking agents. These crosslinking agents can be added to the composition in an amount in a range from 0.01 to 10 wt. %, preferably in an amount in a range from 0.05 to 5 wt. % and more preferably in an amount in a range from 0.1 to 1 wt. %, relative in each case to the total weight of the composition.

This coating composition can then be applied to the substrate in process step II) by known methods, for example by spin coating, dipping, pouring, dropping on, injecting, spraying, knife application, spreading or printing, for example inkjet, screen, intaglio, offset or pad printing, in a wet film thickness of 0.1 µm to 250 µm, preferably in a wet film thickness of 0.5 µm to 50 µm, and then dried at a temperature of 20° C. to 200° C.

The layer at least partially covering the substrate surface in the layer structures according to the invention preferably has a film thickness in a range from 0.01 to 50 µm, preferably in a range from 0.02 to 25 µm and more preferably in a range from 0.02 to 10 µm.

In process step III) the organic solvent is then at least partially removed to obtain an electrically conductive layer comprising the complexes according to the invention or the complexes obtained by the process according to the invention, said removal being performed by simple evaporation.

Provided is a layer structure obtained by the process described above.

In connection with the layer structure according to the invention or the layer structure obtained by the process according to the invention the specific resistance of the electrically conductive layer determined by the test method described herein is less than 10,000 Ω·cm. The specific resistance can optionally be adjusted to the optimum value for the individual application by the selective addition of further polyanions, in particular by the selective addition of further sulphonated synthetic rubber, in particular of further hydrogenated or unhydrogenated sulphonated styrene-diene copolymers or styrene-diene block copolymers, to the composition.

Provided is an electronic component comprising a layer structure according to the invention. In specific embodiments, the electronic components are organic light-emitting diodes, organic solar cells or capacitors. In a more specific embodiment, the use is in capacitors, in particular the use is as a solid electrolyte in capacitors with aluminium oxide as the dielectric.

Provided is the use of a composition according to the invention to produce an electrically conductive layer in electronic components, in particular in organic light-emitting diodes, organic solar cells or capacitors, or to produce an antistatic coating.

The invention is now described in more detail by reference to figures, test methods and non-limiting examples.

FIG. 1 shows the structure of a layer structure 1 according to the invention, for example an antistatic film, in general form. On the substrate surface 3 of a substrate 2, in the case of an antistatic film often a PE, PP or PET layer, is a conductive layer 4 comprising the complexes according to the invention.

Test Methods
Determination of the Specific Resistance
A cleaned glass substrate was placed on top of a spin coater and 10 ml of the PEDOT-comprising dispersion was distributed on the substrate. The supernatant solution was then centrifuged off by rotating the plate. The substrate coated in this way was then dried on a hot plate for 15 minutes at 200° C. The film thickness was measured using a profilometer (Tencor, Alphastep 500). The conductivity was determined by vapour coating Ag electrodes of length 2.5 cm using a shadow mask. The surface resistance determined using an electrometer (Keithley 614) was multiplied by the film thickness to give the specific electrical resistance.

Determination of the Water Content
The water content is determined by means of a Karl Fischer titration. A Metrohm 787 KF Titrino with a 703 titration stand is used to this end. The titration vessel is filled with analytical-grade methanol so that about 1 cm of the platinum electrode is submerged. Then approximately 5 ml of Hydranal buffer acid is pipetted in. The titration cell is automatically dried by starting the KFT program. Preparation is complete when the message "KFT conditioned" appears. Approximately 5 ml of the dispersion to be analysed is then introduced into the titration vessel using a syringe and the exact mass of the dispersion used is determined by back-weighing the syringe. The titration is then started. The measured value is determined as the mean of three individual measurements.

Production of an OLED
1. Preparation of the ITO-Coated Substrate
   ITO-coated glass is cut into pieces (substrates) measuring 50 mm×50 mm and patterned with photoresist to make four parallel lines—each 2 mm wide and 5 cm long. The substrate is then cleaned in an ultrasonic bath in 0.3% Mucasol solution, rinsed with distilled water and spin-dried in a centrifuge Immediately before coating, the ITO-coated side is cleaned in a UV/ozone reactor (PR-100, UVP Inc., Cambridge, GB) for 10 minutes.
2. Application of the Hole-Injecting Layer
   The cleaned ITO substrate is placed on top of a spin coater and the dispersion according to the invention is passed through a filter (Millipore HV, 0.45 µm) and distributed on the ITO-coated side of the substrate. The supernatant solution is then centrifuged by rotating the plate at 1300 rpm for a period of 30 seconds. The substrate coated in this way is then dried on a hot plate for 5 minutes at 200° C. The film thickness is determined using a profilometer (Tencor, Alphastep 500).
3. Application of the Hole-Transport and Emitter Layer
   The ITO substrate coated with the dispersion according to the invention is transferred to a vapour coating unit (Univex 350, Leybold). Under a pressure of $10^{-3}$ Pa, 60 nm of a hole-transport layer consisting of NPB (N,N'-bis(naphthalen-1-yl)-N,N'-bis(phenyl)benzidine) followed by 50 nm of an emitter layer consisting of $AlQ_3$ (tris-(8-hydroxyquinoline) aluminium) are deposited at a deposition rate of 1 Å/second.
4. Application of the Metal Cathode
   The layer system is then transferred to a glove box with an $N_2$ atmosphere and an integrated vacuum coating unit (Edwards) and metallised with metal electrodes. To this end the substrate is placed on a shadow mask with the layer system facing down. The shadow mask comprises 2-mm-wide rectangular slots, which cross the ITO strips at right angles. Under a pressure of $p=10^{-3}$ Pa, a 0.5 nm-thick LiF layer followed by a 200-nm-thick Al layer are deposited in succession from two evaporation boats. The deposition rates are 1 Å/s for LiF and 10 Å/s for Al. The surface area of the individual OLEDs is 4.0 $mm^2$
5. Characterisation of the OLED
   The two electrodes of the organic LED are connected to (brought into contact with) a power supply via electrical leads. The positive pole is connected to the ITO electrode, the negative pole to the metal electrode. The OLED current and the electroluminescence intensity are plotted against the voltage. The electroluminescence is detected with a photodiode (EG&G C30809E) calibrated with a luminance meter (Minolta LS-100) to absolute luminance. The lifetime is then determined by applying a constant current of I=1.92 mA to the arrangements and monitoring the voltage and light intensity as a function of time.

EXAMPLES

Example 1 (According to the Invention)

Production of a PEDOT Dispersion with Iron(III) Tosylate as the Oxidizing Agent 45 g of toluene is added to 90 g of a solution of sulphonated synthetic rubber in cyclohexane (11.2%, Fumion F CL HC 510, ion-exchange capacity 1.9 meq/g, molecular weight of the polymer >100,000 g/mol, Fumatech, Germany) in an 800-ml beaker. 9.0 g of ethylenedioxythiophene (Clevios® M V2, H. C. Starck Clevios GmbH, Germany, or Heraeus Precious Metals GmbH, Germany) is added. Then 47.7 g of a solution of Fe(III) tosylate in ethanol (55%, Clevios CE 55, H. C. Starck Clevios GmbH, Germany) is added. The mixture is stirred for 1 h at room temperature. Then 450 g of cyclohexane is added. The mixture is stirred for 2 minutes and transferred to a 1-liter plastic bottle. After 1 h the supernatant dispersion is decanted off the sediment. It is decanted off again after 14 days.

The solids content of the mixture was 4.0%.

The specific resistance determined by the test method described herein was 5 Ω·cm.

The water content determined by the test method described herein was 0.2%.

Example 2 (According to the Invention)

Production of a PEDOT Dispersion with Iron(III) Tosylate and Benzoyl Peroxide as the Oxidizing Agent 95 g of toluene is added to 23.5 g of a solution of sulphonated synthetic rubber in cyclohexane (11.2%, Fumion F CL HC 510, ion-exchange capacity 1.9 meq/g, molecular weight of the polymer >100,000 g/mol, Fumatech, Germany) in a 250-ml round-bottom flask. 1.08 g of ethylenedioxythiophene (Clevios® M V2, H. C. Starck Clevios GmbH, Germany) is added. Then 0.27 g of a solution of Fe(III) tosylate in ethanol (55%, Clevios® CE 55, H. C. Starck Clevios GmbH, Germany) and 5.24 g of a 40% mixture of benzoyl peroxide in dibutyl phthalate (Sigma Aldrich, USA) are added. The mixture is stirred overnight at room temperature.

The specific resistance determined by the test method described herein was 1300 Ω·cm.

Example 3 (According to the Invention)

Production of a Dispersion with a Specific Resistance of 200 to 300 Ω·Cm 17.8 g of a solution of a sulphonated synthetic rubber in cyclohexane (11.2%, Fumion F CL HC 510, ion-exchange capacity 1.9 meq/g, molecular weight of the polymer >100,000 g/mol, Fumatech, Germany) and 67 g of toluene are added to 50 g of the dispersion according to the invention from Example 1 in a 100-ml beaker. The mixture is stirred for 5 minutes and then filtered through a 0.45 μm syringe filter.

The solids content of the mixture was 2.9%.

The specific resistance determined by the test method described herein was 233 Ω·cm.

Example 4 (According to the Invention)

Production of OLEDs

The dispersion according to the invention from Example 3 was used to construct organic light-emitting diodes (OLEDs). The procedure for producing the OLEDs was as follows:

The film thickness of the layer according to the invention was 50 nm

The characteristic data for the OLEDs is summarised in Example 7.

Example 5 (According to the Invention)

Production of a Crosslinkable Dispersion and Use as a Hole-Injection Layer in an OLED The procedure is the same as in Example 4, with the difference that the dispersion according to the invention from Example 4 was additionally mixed with a crosslinking agent. The liquid crosslinking agent (Silquest A187, Momentive) was added to the dispersion according to the invention from Example 4 in a concentration of 0.1 wt. %. The solution was then filtered (Millipore HV, 0.45 μm), distributed on the ITO substrate and applied by spin coating at 1300 rpm for 30 seconds. The layer was then dried on a hot plate at 200° C. for 5 minutes. The film thickness was 50 nm Successful crosslinking of the layer produced in this way was demonstrated by applying toluene to the dried layer; no visible detachment of the film occurred.

The characteristic data for the OLEDs is summarised in Example 7.

Example 6 (Comparative)

Production of an OLED

The procedure is the same as in Example 4, with the difference that in the $2^{nd}$ process step Clevios® P VP AI4083 (H. C. Starck Clevios GmbH), regarded as a standard in OLED construction, was used as the interlayer instead of the dispersion according to the invention from Example 4. AI4083 was filtered, applied by spin coating at 600 rpm for 30 seconds and then dried on a hot plate at 200° C. for 5 minutes. The film thickness was 50 nm, the specific resistance was 1290 Ω·cm.

The characteristic data for the OLEDs is summarised in Example 7.

Example 7

Comparison of the OLEDs from Examples 4, 5 and 6

The graphs plotting current and electroluminescence against voltage and the lifetime measurements for the OLEDs from Examples 4, 5 and 6 were compared.

In the lifetime measurements the voltage $U_0$ and the luminance $L_0$ at time t=0, the current efficiency as the quotient $L_0/I$, the time for the luminance to fall to 50% of $L_0$, $t@L_{0/2}$, and the voltage at time $t@L_{0/2}$ are analysed.

| | Lifetime of ITO//HIL//NPB//ALQ//LiF//Al-OLEDs @ I = 48 mA/cm² | | | | |
|---|---|---|---|---|---|
| | $U_0$ [V] | $L_0$ [cd/m²] | Efficiency [cd/A] | $t @ L_{0/2}$ [h] | $U(t@L_{0/2})$ [V] |
| OLED from Example 4 (according to the invention) | 7.24 | 1160 | 2.42 | 352 | 9.51 |

-continued

| | Lifetime of ITO//HIL//NPB//ALQ//LiF//Al-OLEDs @ I = 48 mA/cm$^2$ | | | | |
|---|---|---|---|---|---|
| | $U_0$ [V] | $L_0$ [cd/m$^2$] | Efficiency [cd/A] | t @ $L_{0/2}$ [h] | $U(t@L_{0/2})$ [V] |
| OLED from Example 5 (according to the invention) | 6.50 | 1060 | 2.21 | 320 | 9.10 |
| OLED from Example 6 (not according to the invention) | 5.34 | 1160 | 2.42 | 73 | 6.29 |

This demonstrated that the dispersion according to the invention from Example 4 is suitable as an interlayer in OLEDs with and without the addition of a polymeric crosslinking agent. The measured current efficiency corresponds to that of OLEDs constructed in a comparable manner with the standard material Clevios® P VP AI4083. The measured lifetime values with the dispersion according to the invention surpass the values obtained with Clevios® P VP AI4083.

Crosslinking of the dispersion according to the invention makes the layers insoluble in organic solvents such as toluene for example. This means that these layers can also be used in OLEDs in which the layer following the HIL layer, e.g. the emitter layer, is likewise deposited from a solvent. This is the case with polymeric emitters, for example.

Example 8

100 g of the dispersion produced in Example 1 was concentrated in a rotary evaporator. The solids content of the dispersion was then determined by gravimetry as 15.5%. The viscosity of the dispersion was 89 mPas.

Example 9 (Inventive)

Polymerization of EDT Using Benzoyl Peroxide 900 g Toluene are added to 223 g of a solution of sulphonated synthetic rubber in cyclohexane (11.2% Fumion F CL HC 510, ion exchanger capacity 1.9 meq/g, molecular weight of the polymer >100,000 g/mol, Fumatec, Germany) in a 2000 ml round-bottom flask. 10.2 g Ethylenedioxythiophene (Clevios™ M V2, Heraeus, Germans) are added. 45.8 g Dibenzoylperoxide in dibutylphthalate (40%, Sigma Aldrich, USA) are then added under nitrogen atmosphere. The mixture is stiffed under nitrogen for 1 hour at 50° C. and 6 hours at 60° C.

The specific resistance determined according to the test method described herein was 2.03 Ohm·cm.

What is claimed is:
1. A complex comprising
a polythiophene and
a sulphonated synthetic rubber, wherein the sulphonated synthetic rubber is a sulphonated synthetic rubber derived from hydrogenated, optionally partially alkyl-substituted styrene-diene block copolymers.
2. The complex of claim 1, wherein the sulphonated synthetic rubber is a sulphonated synthetic rubber derived from hydrogenated, optionally partially alkyl-substituted styrene-butadiene or styrene-isoprene block copolymers.
3. The complex of claim 1, wherein the sulphonated synthetic rubber is a sulphonated synthetic rubber derived from hydrogenated, optionally partially alkyl-substituted styrene-isoprene block copolymers.
4. The complex of claim 1, wherein the sulphonated synthetic rubber is a sulphonated styrene-butadiene copolymer, in which at least a portion of the styrene units or at least a portion of the butadiene units or at least a portion of the styrene units and at least a portion of the butadiene units in the copolymer are sulphonated.
5. The complex of claim 4, wherein the functionalized styrene-butadiene copolymer is obtained by sulphonation of a styrene-butadiene copolymer.
6. The complex of claim 5, wherein the styrene-butadiene copolymer is a block copolymer.
7. The complex of claim 1, wherein the ion-exchange capacity of the sulphonated synthetic rubber is between 0.01 and 5 meq/g.
8. The complex of claim 1, wherein the sulphonated synthetic rubber has a weight-average molecular weight ($M_w$) determined by gel permeation chromatography in the range of from 1000 to 10,000,000 g/mol.
9. The complex of claim 1, wherein the polythiophene is a poly(3,4-ethylenedioxythiophene).
10. The complex of claim 1, wherein the complex is obtained by a process in which the thiophene monomer is oxidatively polymerized in the presence of the sulphonated synthetic rubber.
11. A process for producing complexes comprising
a polythiophene and
a sulphonated synthetic rubber,
the process comprising, oxidatively polymerizing the thiophene monomer in the presence of the sulphonated synthetic rubber, wherein the sulphonated synthetic rubber is a sulphonated synthetic rubber derived from hydrogenated, optionally partially alkyl-substituted styrene-diene block copolymers.
12. The process of claim 11, wherein the sulphonated synthetic rubber is a sulphonated synthetic rubber derived from hydrogenated, optionally partially alkyl-substituted styrene-butadiene or styrene-isoprene block copolymers.
13. The process of claim 11, wherein the sulphonated synthetic rubber is a sulphonated synthetic rubber derived from hydrogenated, optionally partially alkyl-substituted styrene-isoprene block copolymers.
14. The process of claim 11, wherein the sulphonated synthetic rubber is a sulphonated styrene-butadiene copolymer, in which at least a portion of the styrene units or at least a portion of the butadiene units or at least a portion of the styrene units and at least a portion of the butadiene units in the copolymer are sulphonated.
15. The process of claim 11, wherein the oxidative polymerization of the thiophene monomer takes place in a water-immiscible organic solvent or a mixture of water-immiscible organic solvents.
16. A complex obtained by the process of claim 11.
17. A composition comprising a water-immiscible organic solvent and the complex according to claim 1 dissolved or dispersed in the organic solvent.
18. The composition of claim 17, wherein the composition is obtained by oxidatively polymerizing the thiophene monomer in the presence of the sulphonated synthetic rubber in a water-immiscible organic solvent or a mixture of water-immiscible organic solvents.
19. The composition of claim 17, wherein the composition comprises less than 1 wt. % of water, relative to the total weight of the composition.

20. A layer structure comprising a substrate and an electrically conductive layer applied to at least a part of the substrate surface, wherein the electrically conductive layer comprises the complex according to claim 1.

21. A process for producing a layer structure, the process comprising:
   I) providing a substrate;
   II) applying the composition according to claim 17 to at least a part of the surface of the substrate; and
   III) at least partially removing the organic solvent to obtain an electrically conductive layer comprising the complex comprising the polythiophene and the sulphonated synthetic rubber.

22. A layer structure obtained according to claim 21.

23. The layer structure of claim 20, wherein the electrically conductive layer has a specific resistance of less than 10,000 $\Omega \cdot cm$.

24. An electronic component comprising a layer structure according to claim 20.

25. A method of producing an electrically conductive layer in an electronic component or an antistatic coating, the method comprising using the composition of claim 17 as an electrically conductive layer or as an antistatic coating.

* * * * *